US012360156B2

United States Patent
Yu et al.

(10) Patent No.: US 12,360,156 B2
(45) Date of Patent: Jul. 15, 2025

(54) SELF-DETECTION CIRCUIT BASED ON POWER DETECTOR

(71) Applicant: University of Electronic Science and Technology of China, Chengdu (CN)

(72) Inventors: Yiming Yu, Chengdu (CN); Kai Kang, Chengdu (CN); Chenxi Zhao, Chengdu (CN); Huihua Liu, Chengdu (CN); Yunqiu Wu, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 0 days.

(21) Appl. No.: 18/546,004

(22) PCT Filed: Jan. 13, 2023

(86) PCT No.: PCT/CN2023/072110
§ 371 (c)(1),
(2) Date: Aug. 10, 2023

(87) PCT Pub. No.: WO2024/001161
PCT Pub. Date: Jan. 4, 2024

(65) Prior Publication Data
US 2024/0426902 A1    Dec. 26, 2024

(30) Foreign Application Priority Data
Jun. 30, 2022   (CN) .......................... 202210762352.5

(51) Int. Cl.
*G01R 31/28* (2006.01)
*H01Q 3/36* (2006.01)

(52) U.S. Cl.
CPC ........... *G01R 31/2884* (2013.01); *H01Q 3/36* (2013.01)

(58) Field of Classification Search
CPC .............................. G01R 31/2884; H01Q 3/36
USPC ....................................... 324/750.3, 537, 500
See application file for complete search history.

(56) References Cited

U.S. PATENT DOCUMENTS

| | | | | |
|---|---|---|---|---|
| 7,868,823 | B2* | 1/2011 | Haskell | H01Q 25/00 |
| | | | | 342/372 |
| 9,667,235 | B1* | 5/2017 | Wyse | H03K 5/13 |
| 10,120,021 | B1* | 11/2018 | Silva | G01R 21/02 |
| 10,627,431 | B2* | 4/2020 | Keister | G01R 19/2513 |
| 11,609,251 | B2* | 3/2023 | Teboulle | G01R 22/066 |
| 2019/0229774 | A1* | 7/2019 | Gharavi | H01Q 21/0025 |

OTHER PUBLICATIONS

CN 202210762352.5, Notification to Grant Patent Right for Invention, mailed May 24, 2024, 2 pages. (with English translation).

* cited by examiner

*Primary Examiner* — Giovanni Astacio-Oquendo
(74) *Attorney, Agent, or Firm* — Getech Law LLC; Jun Ye

(57) ABSTRACT

The present invention discloses a Self-detection circuit based on power detector, comprising a power detector, a coupler, a phased array transmitting channel 1 and a phased array transmitting channel 2, and the power detector is divided into two working modes of phase test and amplitude test. The problems that the self-test circuit is complex and large in chip area are solved.

2 Claims, 6 Drawing Sheets

SELF-DETECTION CIRCUIT BASED ON POWER DETECTOR

CROSS REFERENCE OF RELATED APPLICATION

The present application is a 371 of international Application PCT/CN2023/072110, filed Apr. 24, 2023, which claims priority to Chinese Patent Application No. 2022107623525 filed Jun. 30, 2022. The contents of the applications are incorporated herein by reference in their entireties.

TECHNICAL FIELD

The present invention belongs to the field of advanced semiconductor technology, and in particular relates to a Self-detection circuit based on power detector.

BACKGROUND

With the diversification of the application scenarios of the phased array system, the application requirements of the phased array system in extreme environments are correspondingly higher. In the working environment of extremely high temperature and extremely low temperature, the phase control and amplitude control of the phased array system are greatly affected. Although the researchers have also conducted abundant studies on the phased array system for the application scenarios of high and low temperature, accuracy deterioration of key metrics such as phase and amplitude can never be improved very well. The phase and amplitude control accuracy is not only limited by the working environment, but also by the inconsistency of performance between channels caused by uneven heat dissipation under large-scale array integration. One of the ways to solve accuracy deterioration of the phase control module and the amplitude control module in the phased array system is to make correction, and the premise of the correction is to accurately detect the amplitude and phase information of the phased array system. Therefore, research on such problems has become a research hotspot in recent years.

At present, the existing self-test methods are mainly to couple the signal of the phased array system to the self-test link, and convert the radio frequency signal into a DC signal by mixing to zero intermediate frequency. At present, the amplitude of the quadrature I/Q two-way signal is obtained, so the orthogonality of the quadrature signal in the link is relatively high. If the quadrature signal of the link is not orthogonal enough, it will directly lead to a relatively large detected phase information error; the complexity of the self-test link is high, and the use of quadrature signal generators, mixers, driver amplifiers and other modules results in a large chip area. The existing self-test circuit has shortcomings of high complexity and a large chip area.

SUMMARY

The purpose of the present invention is to provide a self-test circuit based on the power detector, which solves the problems of high complexity and large chip area of the self-test circuit.

The following technical solutions are adopted:

A self-test circuit based on the power detector, comprising the power detector, the coupler, the phased array transmitting channel 1 and the phased array transmitting channel 2;

Among them, the power detector is divided into two working modes of phase test and amplitude test:

When the working mode is the phase test mode, the transistors Q3, Q4, Q5 and Q6 are in the cut-off state by biasing Vbias_amp=0V, and the transistors Q1, Q2, Q7, Q8 and Q9 are in the normal working state by biasing Vbias_phase=400 mV; at this time, the transistors Q1, Q2 and transistors Q7, Q8 work at the same DC bias, the four transistors are all biased at Vbias_phase, and the differential signals carrying the phase information are V+_phase and V−_phase; its voltage signals are converted into current signals through the transistors Q1 and Q2 and are carried by $i_{1ph}$ and $i_{2ph}$, while V+_amp and V−_amp have no signal at this time; at the same time, under the same bias of Q7 and Q8, the corresponding DC current is $i_{dc}$, and at node A, the sum of $i_{1ph}$ and $i_{2ph}$ is $I_1$, and high-frequency signals are filtered out by cap2; current signals are converted into voltage signals through resistor R2, and the voltages at node A and node B are subtracted to obtain the DC voltage representing the phase information;

When the working mode is amplitude test, the transistors Q1, Q2, Q7, and Q8 are biased at Vbias_phase=0V, and the transistors do not work; the transistors Q3, Q4, Q5, and Q6 are biased at Vbias_amp=400 mV, and the transistors work normally; at this time, the differential signals V+_amp and V−_amp carrying the amplitude information are converted into current signals through the transistors Q3 and Q4 and are carried by the currents $i_{1amp}$ and $i_{2amp}$, while V+_phase and V−_phase have no signals; the transistors Q5 and Q6 only have DC bias, and the current generated by the bias is $i_{dc}$; at node A, the sum of $i_{1amp}$ and $i_{2amp}$ is $I_1$, the high-frequency signals are filtered out by cap2, and the DC current $i_{dc}$ corresponding to the transistors Q5 and Q6 is summed to be I2; the currents $I_1$ and $I_2$ are converted to DC voltage through the resistor $R_2$, and are subtracted to obtain the DC voltage carrying the amplitude information.

Preferably, in the phased array transmitting channel 1 and the phased array transmitting channel 2, the variable gain amplifier controls the radio frequency signal by changing the gain; the phase shifter is to change the phase of the radio frequency signal within a 360° range, and the power amplifier is to provide gain and amplify the power of the radio frequency signal to increase the transmitting power of the antenna; the amplitude and phase information of the phased array transmitting channel 1 and the phased array transmitting channel 2 is extracted to the self-test circuit through the coupler, and the power detector detects the amplitude and phase information and outputs the test voltage.

Preferably, when the working mode of the power detector is the phase test mode, the signal of the phased array transmitting channel 1 passing through the coupler is $v_1 = A_1 \cos(\omega t + \varphi_1)$, the signal of the phased array transmitting channel 2 through the coupler is $v_2 = A_2 \cos(\omega t + \varphi_2)$; the difference between the two signals through the transformer is calculated and becomes a differential signal, $$\Delta V = v_1 - v_2 = A_1\cos(\omega t + \varphi_1) - A_2\cos(\omega t + \varphi_2) = \\ -2A_1\sin\left(\frac{\varphi_1 - \varphi_2}{2}\right)\sin\left(\omega t + \frac{\varphi_1 + \varphi_2}{2}\right) + (A_2 - A_1)\cos(\omega t + \varphi_2) \quad (1)$$

The differential signals are:

$$\Delta V_+ = v_1 - v_2 = A_1\cos(\omega t + \varphi_1) - A_2\cos(\omega t + \varphi_2) = \quad (2)$$

-continued $$-A_1\sin\left(\frac{\varphi_1-\varphi_2}{2}\right)\sin\left(\omega t+\frac{\varphi_1+\varphi_2}{2}\right)+\frac{1}{2}(A_2-A_1)\cos(\omega t+\varphi_2)$$

$$\Delta V_- = v_1 - v_2 = A_1\cos(\omega t+\varphi_1) - A_2\cos(\omega t+\varphi_2) = \quad (3)$$

$$A_1\sin\left(\frac{\varphi_1-\varphi_2}{2}\right)\sin\left(\omega t+\frac{\varphi_1+\varphi_2}{2}\right)+\frac{1}{2}(A_2-A_1)\cos(\omega t+\varphi_2)$$

The differential signal is sent to the power detector with the amplitude detected.

When detecting the phase, the differential signal carrying the phase information enters the transistors Q1 and Q2 and is converted into currents is $i_{1ph}$, $i_{2ph}$. At the same time, Q7 and Q8 work at the same DC operating bias as Q1 and Q2; therefore, the difference between the output current $I_1$ of Q1 and Q2 and the output current $I_2$ of Q7 and Q8 is calculated:

$$i_{1ph} = K(\Delta V_+ + v_{gs} - v_{th})^2 \quad (4)$$

$$i_{2ph} = K(\Delta V_- + v_{gs} - v_{th})^2 \quad (5)$$

$$i_{dc} + K(v_{gs} - v_{th})^2 \quad (6)$$

$$K = \frac{W}{2L}\mu C_{ox} \quad (7)$$

$$I_1 = i_{1ph} + i_{2ph} \quad (8)$$

$$I_2 = 2 \times i_{dc} \quad (9)$$

$$\Delta I = I_1 - I_2 = 2K\Delta V_+^2 \quad (10)$$

$$= 2K\left(A_1\sin\left(\frac{\varphi_1-\varphi_2}{2}\right)\right)^2[1-\cos(2\omega t+\varphi_1+\varphi_2)] \quad (11)$$

$$DC|\Delta I| = 2K\left(A_1\sin\frac{\varphi_1-\varphi_2}{2}\right)^2 \quad (12)$$

$$V_{out} = DC|\Delta I| \times R_2 = 2K\left(A_1\sin\frac{\varphi_1-\varphi_2}{2}\right)^2 R_2 \quad (13)$$

$$\varphi_1 - \varphi_2 = \arcsin\left[\frac{\sqrt{V_{out}/2KR_L}}{A_1}\right] \quad (14)$$

The current $\Delta I$ containing the phase information is obtained, and finally it becomes the voltage information $V_{out}$ through the load resistor R2; finally, a function corresponding to the difference between the phase and the output voltage is obtained, that is, formula (14); sin $(\varphi_1-\varphi_2)$ is linearly related to $\sqrt{V_{out}}$.

Preferably, when the power detector detects the amplitude, the signal of the phased array transmitting channel 1 passing through the coupler is $v_1 = A_1 \cos(\omega t+\varphi_1)$; the signal of the phased array transmitting channel 2 passing through the coupler is $v_2 = A_2 \cos(\omega t+\varphi_1)$; the difference between the two signals through the transformer is calculated and becomes a differential signal, $$\Delta V_+ = (A_1 - A_2)\cos(\omega t+\varphi_1) \quad (16)$$

$$\Delta V_- = -(A_1 - A_2)\cos(\omega t+\varphi_1) \quad (17)$$

$$i_{1amp} = K(\Delta V_+ + v_{gs} - v_{th})^2 \quad (18)$$

$$i_{2amp} = K(\Delta V_- + v_{gs} - v_{th})^2 \quad (19)$$

$$K = \frac{W}{2L}\mu C_{ox}$$

$$I_1 = i_{1amp} + i_{2amp} \quad (20)$$

$$I_2 = 2 \times i_{dc} \quad (21)$$

-continued $$\Delta I = I_1 - I_2 = 2K\Delta V_+^2 = K(A_1-A_2)^2 + K\cos(2(\omega t+\varphi_1)) \quad (22)$$

$$DC|\Delta I| = K(A_1-A_2)^2 \quad (23)$$

$$V_{out} = DC|\Delta I| \times R_2 = K(A_1-A_2)^2 R_2 \quad (24)$$

$$A_1 - A_2 = \sqrt{\frac{V_{out}}{KR_2}} \quad (25)$$

When detecting the amplitude, the differential signal carrying the amplitude information sent to the transistors Q3 and Q4 are converted into currents $i_{1amp}$, $i_{2amp}$. At the same time, Q5 and Q6 work at the same DC operating bias as Q3 and Q4; therefore, the difference between the output current $I_1$ of Q3 and Q4 and the output current $I_2$ of Q5 and Q6 is calculated to obtain the current $I_2$ that only contains the amplitude information, and finally it becomes the voltage information $V_{out}$ through the load resistance R2; a function corresponding to the difference between the amplitude and the output voltage is obtained, that is, formula (25);

When detecting the amplitude, the amplitude control unit of the phased array transmitting channel 2 is configured to the minimum gain state; at this time, the signal coupled to the power detector by the phased array transmitting channel 2 through the coupler is very small compared with the signal coupled to the power detector by the phased array transmitting channel 1, so $A_2$ is ignored, which is obtained from formula (25):

$$A_1 = \sqrt{\frac{V_{out}}{KR_2}} \quad (26)$$

Then, the voltage amplitude $A_1$ is converted to power $P_1$/dBm:

$$P_1 = 10\log(V_{out}) - 10\log(KR_2) \quad (27)$$

It can be seen from formula (27) that the power $P_1$ is proportional to 10 log $(V_{out})$.

The beneficial effects of the present invention are as follows: the circuit of the present invention converts phase information into amplitude information by using the difference and sum of products formula, and then detects the amplitude and phase information of the phased array system through the power detector. Based on advanced semiconductor technology, the present invention converts phase information into amplitude information, and then uses the power test circuit to detect the amplitude and phase information of the phased array system; the present invention converts the phase information between the channels of the phased array system into amplitude information, and the phase test is realized through the power detector. Therefore, the circuit complexity is very low, the circuit structure is simple, and a smaller chip area is occupied.

EMBODIMENTS

The technical solutions in the embodiments of the present invention will be clearly and completely described below. Obviously, the described embodiments are only a part of the embodiments of the present invention, but not all of the embodiments. Based on the embodiments of the present invention, all other embodiments obtained by those of ordinary skill in the field without creative efforts shall fall within the protection scope of the present invention.

Figure 1:
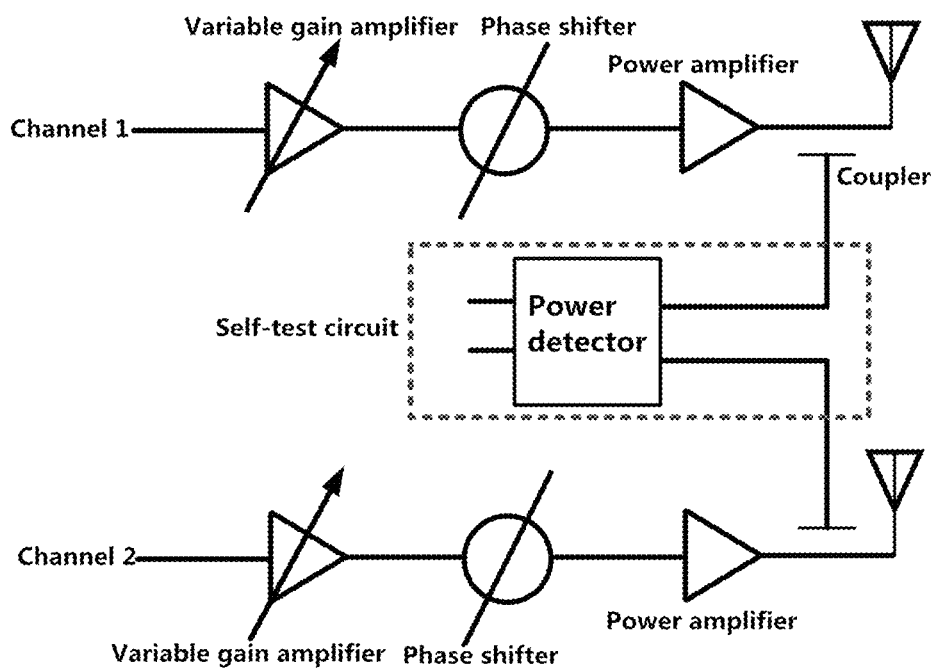
FIG. 1 is the self-test architecture for phased array amplitude and phase information of the present invention.

In FIG. 1, a self-test circuit based on the power detector comprises a power detector, a coupler, the phased array transmitting channel 1 and the phased array transmitting channel 2; the power detector is divided into two working modes of phase test and amplitude test.

Figure 4:
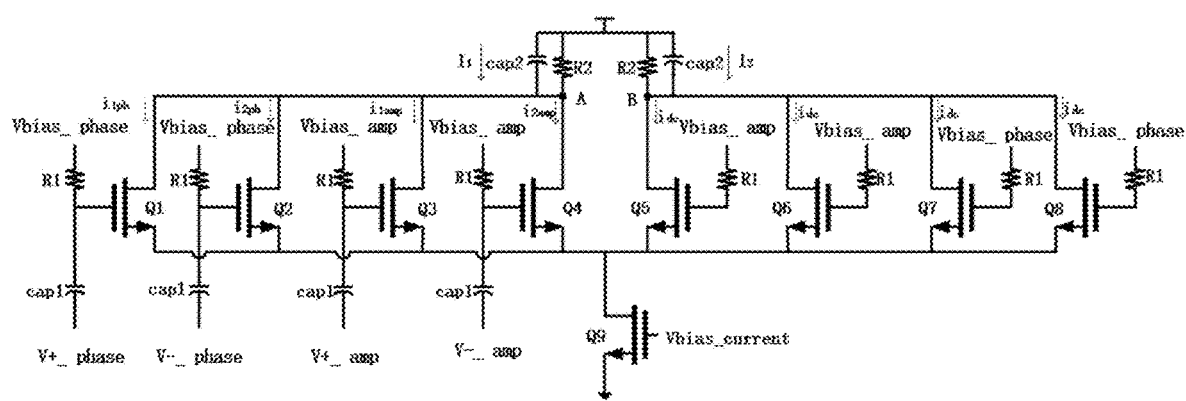
FIG. 4 is the structure of the power detector of the present invention.

As shown in FIG. 4, when the working mode is the phase test mode, the transistors Q3, Q4, Q5 and Q6 are in the cut-off state by biasing Vbias_amp=0V, and the transistors Q1, Q2, Q7, Q8 and Q9 are in the normal working state by biasing Vbias_phase=400 mV; at this time, the transistors Q1, Q2 and transistors Q7, Q8 work at the same DC bias, the four transistors are all biased at Vbias_phase, and the differential signals carrying the phase information are V+_phase and V−_phase; its voltage signals are converted to current signals through the transistors Q1 and Q2 and are carried by $i_{1ph}$ and $i_{2ph}$, while V+_amp and V−_amp have no signal at this time; at the same time, under the same bias of Q7 and Q8, the corresponding DC current is $i_{dc}$, and at node A, the sum of $i_{1ph}$ and $i_{2ph}$ is $I_1$, and high-frequency signals are filtered out by cap2; current signals are converted into voltage signals through resistor R2, and the voltages of node A and node B are subtracted to obtain the DC voltage representing the phase information;

When the working mode is amplitude test, the transistors Q1, Q2, Q7, and Q8 are biased at Vbias_phase=0V, and the transistors do not work; the transistors Q3, Q4, Q5, and Q6 are biased at Vbias_amp=400 mV, and the transistors work normally; at this time, the differential signals V+_amp and V−_amp carrying the amplitude information are converted into current signals through the transistors Q3 and Q4 and are carried by the currents $i_{1amp}$ and $i_{2amp}$, while V+_phase and V−_phase have no signals; the transistors Q5 and Q6 only have DC bias, and the current generated by the bias is $i_{dc}$; at node A, the sum of $i_{1amp}$ and $i_{2amp}$ is $I_1$, the high-frequency signals are filtered out by the capacitor cap2, and the DC current $i_{dc}$ corresponding to the transistors Q5 and Q6 is summed to be $I_2$; the currents $I_1$ and $I_2$ are converted to DC voltage through the resistor R2, and are subtracted to obtain the DC voltage carrying the amplitude information. For the specific formula derivation, see (1)-(27).

Figure 2:
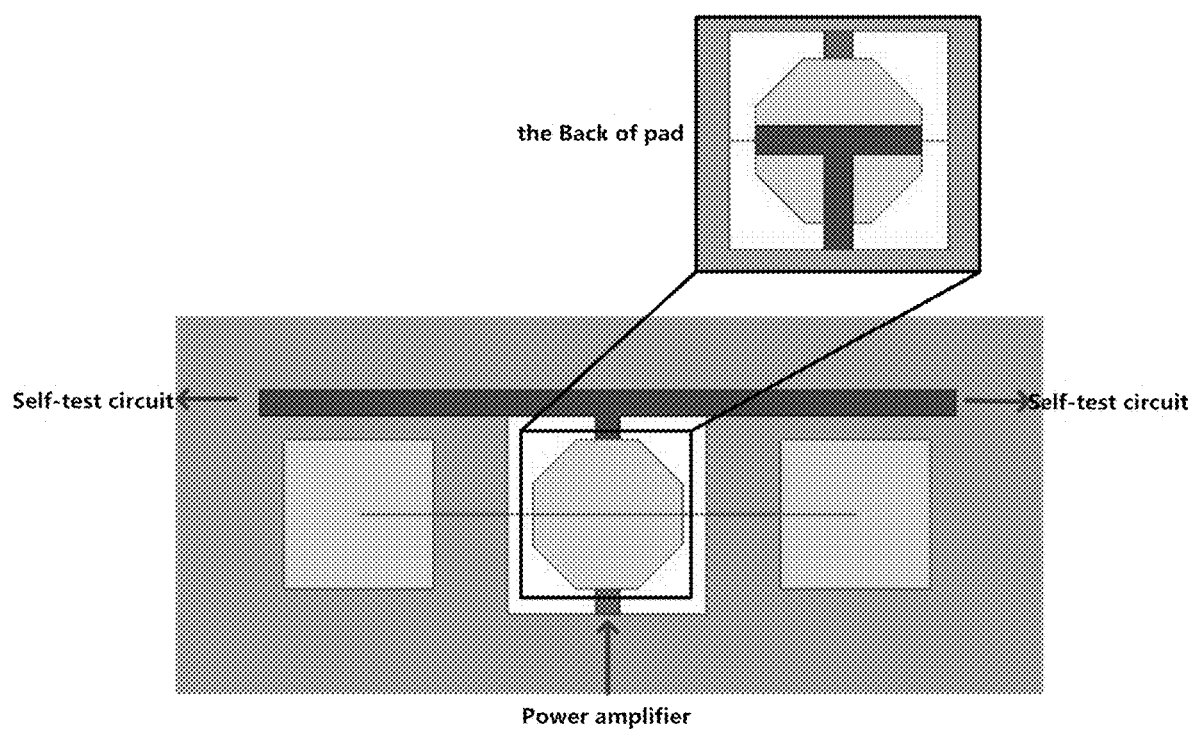
FIG. 2 is the top view of the 3D model of the coupler of the present invention.
Figure 3:
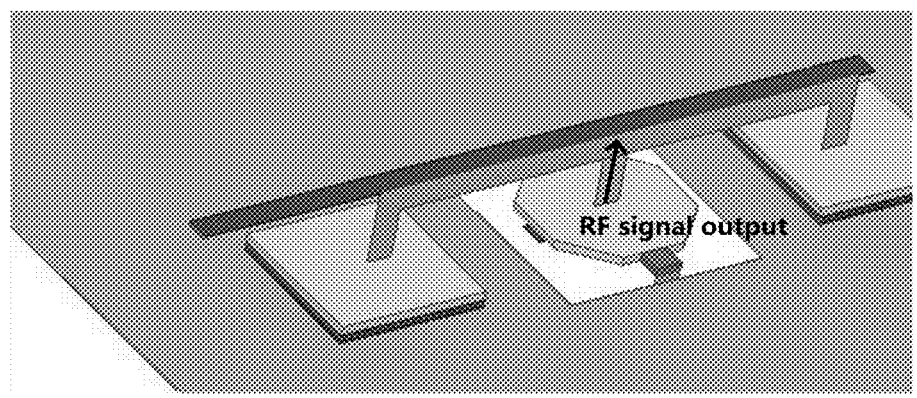
FIG. 3 is the oblique view of the 3D model of the coupler of the present invention.

As shown in FIG. 2, the entire large plane is the ground plane, in which the dark part is the m7 layer, and the rest is the m9 layer. The specific model is shown on the back of the pad in FIG. 3. The signal of the phased array system passes through the power amplifier, is transmitted to the Spad, and is capacitively coupled to the self-test circuit.

In the phased array transmitting channel 1 and the phased array transmitting channel 2, the variable gain amplifier controls the radio frequency signal by changing the gain; the phase shifter is to change the phase of the radio frequency signal within a 360° range, and the power amplifier is to provide gain and amplify the power of the radio frequency signal to increase the transmitting power of the antenna. The amplitude and phase information of the channel 1 and the channel 2 is extracted to the self-test circuit through the coupler, and the power detector detects the amplitude and phase information and outputs the test voltage.

As shown in FIG. 4, the power detector is mainly composed of 9 NMOS transistors Q1-Q9, and there are two working states of phase test and amplitude test. When working in phase test, the bias voltage of the transistors Q1, Q2, Q7, and Q8 is 400 mV, and the transistors work in the saturation region; the transistors Q3, Q4, Q5, and Q6 are biased at 0 mV, and the transistors are not turned on; when working in amplitude test, Q3, Q4, Q5, Q6 are biased at 400 mV, and the transistors Q1, Q2, Q7, Q8 are biased at 0 mV; the transistor Q9 is worked as a tail current source, biased at 600 mV, that is, Vbias_current=600 mV. The Capacitor cap1 is an interval capacitor whose value is 1 pF, capacitor cap2 is a filter capacitor whose value is 968 fF; resistor R1=5 kΩ and resistor R2 is a load resistor whose value is 1 kΩ. For phase information, the theoretical derivation is as follows:

The signal of the phased array transmitting channel 1 passing through the coupler is $v_1=A_1\cos(\omega t+\varphi_1)$; the signal of the phased array transmitting channel 2 through the coupler is $v_2=A_2\cos(\omega t+\varphi_2)$; the difference between the two signals through the transformer is calculated and becomes a differential signal, $$\Delta V = v_1 - v_2 = A_1\cos(\omega t + \varphi_1) - A_2\cos(\omega t + \varphi_2) = \qquad (1)$$
$$-2A_1\sin\left(\frac{\varphi_1-\varphi_2}{2}\right)\sin\left(\omega t + \frac{\varphi_1+\varphi_2}{2}\right) + (A_2 - A_1)\cos(\omega t + \varphi_2)$$

The differential signals are:

$$\Delta V_+ = v_1 - v_2 = A_1\cos(\omega t + \varphi_1) - A_2\cos(\omega t + \varphi_2) = \qquad (2)$$
$$-A_1\sin\left(\frac{\varphi_1-\varphi_2}{2}\right)\sin\left(\omega t + \frac{\varphi_1+\varphi_2}{2}\right) + \frac{1}{2}(A_2 - A_1)\cos(\omega t + \varphi_2)$$

$$\Delta V_- = v_1 - v_2 = A_1\cos(\omega t + \varphi_1) - A_2\cos(\omega t + \varphi_2) = \qquad (3)$$
$$A_1\sin\left(\frac{\varphi_1-\varphi_2}{2}\right)\sin\left(\omega t + \frac{\varphi_1+\varphi_2}{2}\right) + \frac{1}{2}(A_2 - A_1)\cos(\omega t + \varphi_2)$$

When the phase is detected, the differential signal carrying the phase information enters the transistors Q1 and Q2 and is converted into currents $i_{1ph}$, $i_{2ph}$. At the same time, Q7 and Q8 work at the same DC operating bias as Q1 and Q2; therefore, the difference between the output current $I_1$ of Q1 and Q2 and the output current $I_2$ of Q7 and Q8 is calculated:

$$i_{1ph} = K(\Delta V_+ + v_{gs} - v_{th})^2 \qquad (4)$$

$$i_{2ph} = K(\Delta V_- + v_{gs} - v_{th})^2 \qquad (5)$$

$$i_{dc} + K(v_{gs} - v_{th})^2 \qquad (6)$$

$$K = \frac{W}{2L}\mu C_{ox} \qquad (7)$$

$$I_1 = i_{1ph} + i_{2ph} \qquad (8)$$

$$I_2 = 2 \times i_{dc} \qquad (9)$$

$$\Delta I = I_1 - I_2 = 2K\Delta V_+^2 \qquad (10)$$

-continued $$= 2K\left(A_1\sin\left(\frac{\varphi_1-\varphi_2}{2}\right)\right)^2[1-\cos(2\omega t+\varphi_1+\varphi_2)] \quad (11)$$

$$DC|\Delta I|\times R_2 = 2K\left(A_1\sin\frac{\varphi_1-\varphi_2}{2}\right)^2 \quad (12)$$

$$V_{out} = DC|\Delta I|\times R_2 = 2K\left(A_1\sin\frac{\varphi_1-\varphi_2}{2}\right)^2 R_2 \quad (13)$$

$$\varphi_1-\varphi_2 = \arcsin\left[\frac{\sqrt{V_{out}/2KR_L}}{A_1}\right] \quad (14)$$

When the phase is detected, the differential signal carrying the phase information sent to the transistors Q1 and Q2 are converted into currents $i_{1ph}$, $i_{2ph}$. At the same time, Q7 and Q8 work at the same DC operating bias as Q1 and Q2. Therefore, the difference between the output current $I_1$ of Q1 and Q2 and the output current $I_2$ of Q7 and Q8 is calculated to obtain the current $\Delta I$ containing only the phase information, and finally it becomes voltage information $V_{out}$ through the load resistor R2. A function corresponding to the difference between the phase and the output voltage is obtained, that is, the formula (14). We can obtain from formula (14):

$$\sin(\varphi_1-\varphi_2) = \frac{1}{A_1\sqrt{2KR_2}}\sqrt{V_{out}} \quad (15)$$

$\sin(\varphi_1-\varphi_2)$ is linearly related to $\sqrt{V_{out}}$.

For the amplitude information, the specific derivation is as follows:

Assuming that the signal of the phased array transmitting channel 1 passing through the coupler is $v_1=A_1\cos(\omega t+\varphi_1)$; the signal of the phased array transmitting channel 2 passing through the coupler is $v_2=A_2\cos(\omega t+\varphi_1)$; the difference between the two signals through the transformer is calculated and becomes a differential signal, $$\Delta V_+ = (A_1-A_2)\cos(\omega t+\varphi_1) \quad (16)$$

$$\Delta V_- = -(A_1-A_2)\cos(\omega t+\varphi_1) \quad (17)$$

$$i_{1amp} = K(\Delta V_+ + v_{gs} - v_{th})^2 \quad (18)$$

$$i_{2amp} = K(\Delta V_- + v_{gs} - v_{th})^2 \quad (19)$$

$$K = \frac{W}{2L}\mu C_{ox}$$

$$I_1 = i_{1amp} + i_{2amp} \quad (20)$$

$$I_2 = 2\times i_{dc} \quad (21)$$

$$\Delta I = I_1 - I_2 = 2K\Delta V_+^2 = K(A_1-A_2)^2 + K\cos(2\omega t+\varphi_1)) \quad (22)$$

$$DC|\Delta I| = K(A_1-A_2)^2 \quad (23)$$

$$V_{out} = DC|\Delta I|\times R_2 = K(A_1-A_2)^2 R_2 \quad (24)$$

$$A_1 - A_2 = \sqrt{\frac{V_{out}}{KR_2}} \quad (25)$$

When the amplitude is detected, the differential signal carrying the amplitude information sent to the transistors Q3 and Q4 are converted into currents $i_{1amp}$, $i_{2amp}$. At the same time, Q5 and Q6 work at the same DC operating bias as Q3 and Q4; therefore, the difference between the output current $I_1$ of Q3 and Q4 and the output current $I_2$ of Q5 and Q6 is calculated to obtain the current $I_2$ that only contains the amplitude information, and finally it becomes the voltage information $V_{out}$ through the load resistance R2; a function corresponding to the difference between the amplitude and the output voltage is obtained, that is, formula (25); When detecting the amplitude, the amplitude control unit of the phased array transmitting channel 2 is configured to the minimum gain state; at this time, the signal coupled to the power detector by the phased array transmitting channel 2 through the coupler is very small compared with the signal coupled to the power detector by the phased array transmitting channel 1, so $A_2$ is ignored, which is obtained from formula (25):

$$A_1 = \sqrt{\frac{V_{out}}{KR_2}} \quad (26)$$

Then, the voltage amplitude $A_1$ is converted to power $P_1$/dBm:

$$P_1 = 10\log(V_{out}) - 10\log(KR_2) \quad (27)$$

It can be seen from formula (27) that the power $P_1$ is proportional to $10\log(V_{out})$.

It can be seen from the simulation software verification that the circuit architecture is in good agreement with the theoretical formula channel.

Figure 5:
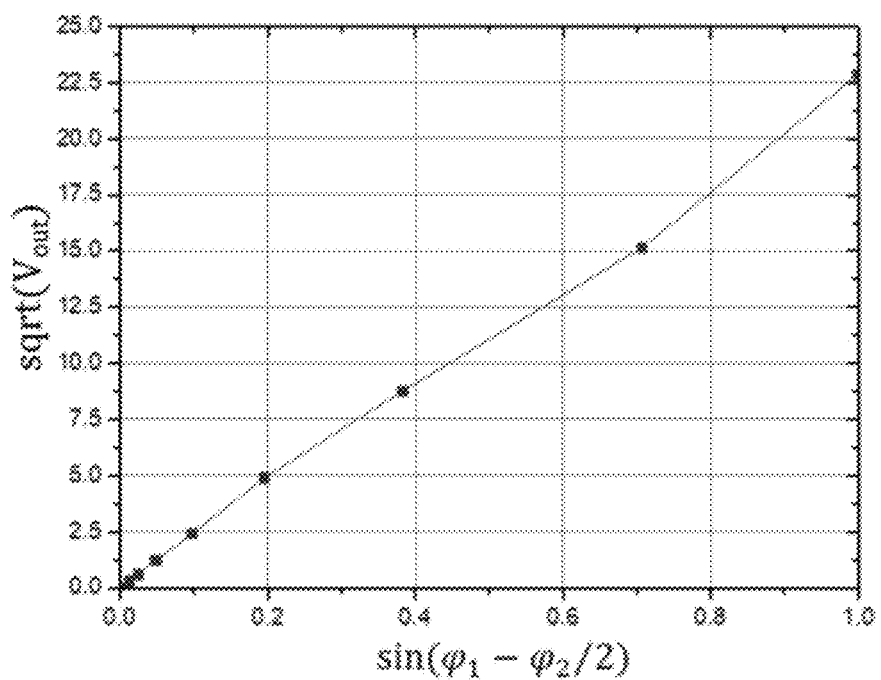
FIG. 5 is a diagram showing the relationship between $\sqrt{V_{out}}$ and $\sin(\varphi_1-\varphi_2)$.

The specific results are shown in FIG. 5.

It can be clearly seen from FIG. 5 that $\sqrt{V_{out}}$ is linearly related to $\sin(\varphi_1-\varphi_2)$, which is consistent with the theoretical derivation, indicating that the self-test circuit can more accurately detect the phase difference between the channels of the phased array system.

Figure 6:
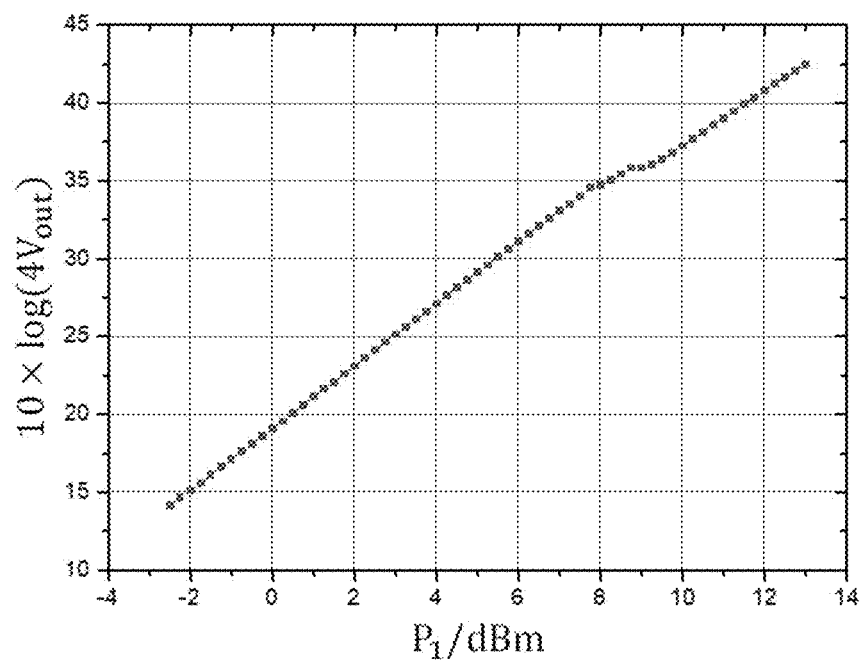
FIG. 6 is a diagram showing the relationship between $10\log(V_{out})$ and $P_1$.

As shown in FIG. 6, $10\log(V_{out})$ is proportional to Pa which is consistent with the theoretical derivation, indicating that in the range of the output power (−3 dBm-13 dBm) of the phased array system channel, the self-test link can more accurately detect the amplitude of the phased array system.

In order to ensure that the phased array system can be used normally in a complex electromagnetic-thermal environment, the phased array system needs to resist PVT. As the core module in the phased array system, the performance of the amplitude and phase control module has a crucial impact on the core indicators such as beam biasing, beam scanning, and sidelobe suppression of the phased array. However, when affected by PVT, the precision and accuracy of phase and amplitude control tend to deteriorate more seriously. The current mainstream research on this problem is mainly to design an amplitude and phase control circuit that is less affected by PVT to minimize the impact of PVT on the phased array system, or introduce a compensation circuit to compensate for the amplitude and phase control accuracy deterioration caused by different working environments. However, this method cannot effectively avoid the influence of PVT on the amplitude and phase control of the phased array system. In this context, a test link for the amplitude and phase of the phased array system is proposed, which can be used to quickly and easily detect the amplitude and phase performance of the phased array system after the deterioration of the amplitude and phase performance, thus laying the foundation for the self-calibration of the phased array system.

While the present invention has been described in details with respect to the above preferred embodiments, it should be understood that the above description should not be taken as a limitation of the present invention. Various modifications and alternatives to the present invention will occur to those skilled in the art upon reading the foregoing description. Accordingly, the scope of protection of the present invention should be defined by the appended claims.

The invention claimed is:

1. A self-test circuit based on power detector, characterized in that it comprises a power detector, a coupler, a phased array transmitting channel 1, and a phased array transmitting channel 2;

an amplitude and phase information of phased array transmit channels 1 and 2 are extracted from the coupler and input into the self-test circuit;

the power detector, comprising Q1-Q9 NMOS transistors, detects the amplitude and phase information, and outputs a detection voltage;

the Q1-Q9 NMOS transistors form the core components of the power detector, wherein Q1, Q2, Q3, and Q4 have their respective drains connected to a node A with their respective sources linked to the drain of Q9, the gate of Q1 is connected to the positive end of a RF differential signal through a first DC blocking capacitor, the gate of Q2 is connected to the negative end of the RF differential signal through a second DC blocking capacitor, the gate of Q3 is connected to the positive end of the RF differential signal through a third DC blocking capacitor, the gate of Q4 is connected to the negative end of the RF differential signal through a fourth DC blocking capacitor, the gates of Q1-Q4 and Q5-Q8 connect either directly or indirectly to respective bias circuits, their drains connect together before connecting to a node B, wherein their sources connect back to the drain of Q9, and the drain of Q9 connects back through biasing circuits, completing a loop connection with source terminals grounded, wherein Q9 serves as a tail current source biased at 600 mV, wherein the capacitance value for all the DC blocking capacitors is set at 1 pF, parallel load resistors and filtering capacitors connect each supply terminal separately with the node A and the node B respectively, wherein the filtering capacitors hold capacitance values set at 968 fF each and the load resistor values remain constant at 1 kΩ;

the power detector is divided into two working modes, comprising a phase test mode and an amplitude test mode, wherein the phase test mode is characterized as follows: Q3, Q4, Q5 and Q6 are in the cut-off state by biasing Vbias_amp-0V, and Q1, Q2, Q7, Q8 and Q9 are in the normal working state by biasing Vbias_phase=400 mV; at this time, Q1, Q2 and Q7, Q8 work at the same DC bias, Q1, Q2 and Q7, Q8 are all biased at Vbias_phase, and the differential signals carrying the phase information are V+_phase and V-_phase; its voltage signals are converted to current signals through Q1 and Q2 and are carried by $i_{1ph}$ and $i_{2ph}$, while V+_amp and V-_amp have no signal at this time; at the same time, under the same bias of Q7 and Q8, the corresponding DC current is $i_{dc}$, and at node A, the sum of $i_{1ph}$ and $i_{2ph}$ is $I_1$, and high-frequency signals are filtered out by a capacitor filter; the current signals are converted into voltage signals through load resistor, and the voltages at node A and node B are subtracted to obtain the DC voltage representing the phase information;

wherein the amplitude test mode is characterized as follows: Q1, Q2, Q7, and Q8 are biased at Vbias_phase-0V, and the transistors do not work; Q3, Q4, Q5, and Q6 are biased at Vbias_amp=400 mV, and the transistors work normally; at this time, the differential signals V+_amp and V-_amp carry amplitude information, the voltage signal after passing through Q3 and Q4 is converted into a current signal, and then transmitted by currents i1amp and i2amp, wherein while V+_phase and V-_phase have no signals; Q5 and Q6 only have DC bias, and the current generated by the bias is $i_{dc}$;

at node A, the sum of $i_{1amp}$ and $i_{2amp}$ is $I_1$, the high-frequency signals are filtered out by the capacitor filter, and the DC current $i_{dc}$ corresponding to Q5 and Q6 is summed to be $I_2$; the currents $I_1$ and $I_2$ are converted to DC voltage through the resistor load, and are subtracted to obtain the DC voltage carrying the amplitude information;

wherein the phase test mode is further characterized as follows: the signal of the phased array transmitting channel 1 passing through the coupler is $v_1 = A_1 \cos(\omega t + \varphi_1)$, and the signal from the phased array transmitter channel 2 through the coupler is $v_2 = A_2 \cos(\omega t + \varphi_2)$; the values of $A_1$ and $A_2$ are equal, and the two signals are transformed by a transformer to become a differential signal:

$$\Delta V = v_1 - v_2 = A_1 \cos(\omega t + \varphi_1) - A_2 \cos(\omega t + \varphi_2) = -2A_1 \sin\left(\frac{\varphi_1 - \varphi_2}{2}\right) \sin\left(\omega t + \frac{\varphi_1 + \varphi_2}{2}\right)$$

the current is converted into voltage information through a load resistor $$V_{out}, \sin\left(\frac{\varphi_1 - \varphi_2}{2}\right)$$

is linearly related to $\sqrt{V_{out}}$, wherein when the power detector detects the amplitude, the signal of the phased array transmitting channel 1 passing through the coupler is $v_1 = A_1 \cos(\omega t + \varphi_1)$; the signal of the phased array transmitting channel 2 passing through the coupler is $v_2 = A_2 \cos(\omega t + \varphi_1)$, the difference between the two signals through the transformer is calculated and becomes a differential signal, when $A_2$ is set to 0, then converting the voltage amplitude $A_1$ to power $P_1$/dBm yields:

power $P_1$ is proportional to $10\log(4V_{out})$.

2. A self-test circuit based on power detector according to claim 1, characterized in that, in the phased array transmitting channel 1 and the phased array transmitting channel 2, the variable gain amplifier controls the radio frequency signal by changing the gain; the phase shifter is to change the phase of the radio frequency signal within a 360° range, and the power amplifier is to provide gain and amplify the power of the radio frequency signal to increase the transmitting power of the antenna; the amplitude and phase information of the phased array transmitting channel 1 and the phased array transmitting channel 2 is extracted to the self-test circuit through the coupler, and the power detector detects the amplitude and phase information and outputs the test voltage.

* * * * *